(12) United States Patent
Nangoy

(10) Patent No.: US 9,196,498 B1
(45) Date of Patent: Nov. 24, 2015

(54) STATIONARY ACTIVELY-COOLED SHADOW RING FOR HEAT DISSIPATION IN PLASMA CHAMBER

(71) Applicant: Roy C. Nangoy, Santa Clara, CA (US)

(72) Inventor: Roy C. Nangoy, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/458,021

(22) Filed: Aug. 12, 2014

(51) Int. Cl.
| | |
|---|---|
| *H01L 21/306* | (2006.01) |
| *H01L 21/3065* | (2006.01) |
| *H01J 37/32* | (2006.01) |
| *H01L 21/78* | (2006.01) |
| *H01L 23/544* | (2006.01) |
| *H01L 21/67* | (2006.01) |
| *H01L 21/683* | (2006.01) |
| *H01L 21/673* | (2006.01) |

(52) U.S. Cl.
CPC ....... *H01L 21/3065* (2013.01); *H01J 37/32568* (2013.01); *H01J 37/32642* (2013.01); *H01L 21/673* (2013.01); *H01L 21/67069* (2013.01); *H01L 21/67207* (2013.01); *H01L 21/6831* (2013.01); *H01L 21/6836* (2013.01); *H01L 21/78* (2013.01); *H01L 23/544* (2013.01); *H01J 2237/002* (2013.01); *H01J 2237/024* (2013.01); *H01J 2237/334* (2013.01); *H01L 2221/68327* (2013.01); *H01L 2223/5446* (2013.01)

(58) Field of Classification Search
CPC . H01L 21/306; H01L 21/78; H01L 21/67069; H01L 21/6831; H01L 21/6836; H01L 21/673; H01J 37/32568; H01J 37/32642
See application file for complete search history.

(56) References Cited

U.S. PATENT DOCUMENTS

| | | | |
|---|---|---|---|
| 4,049,944 A | 9/1977 | Garvin et al. |
| 4,339,528 A | 7/1982 | Goldman |
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Savitr Mulpuri
(74) *Attorney, Agent, or Firm* — Blakely Sokoloff Taylor Zafman LLP

(57) ABSTRACT

Methods of and apparatuses for dicing semiconductor wafers, each wafer having a plurality of integrated circuits, are described. In an example, a plasma processing apparatus includes a processing chamber having a chamber wall. The plasma processing apparatus also includes a plasma source in an upper portion of the processing chamber. A sample support is included for situating a sample below the plasma source. An actively-cooled shadow ring having a cooling channel therein for cooling fluid transport is fixedly attached to the chamber wall of the processing chamber, between the plasma source and the sample support.

4 Claims, 13 Drawing Sheets

(56) References Cited

U.S. PATENT DOCUMENTS

| | | |
|---|---|---|
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 8,912,075 B1 * | 12/2014 | Lei et al. .................. 438/460 |
| 2003/0162313 A1 | 8/2003 | Kim et al. |
| 2003/0217693 A1 * | 11/2003 | Rattner et al. .................. 118/500 |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0248451 A1 | 9/2010 | Pirogovsky et al. |
| 2011/0312157 A1 | 12/2011 | Lei et al. |
| 2012/0238073 A1 | 9/2012 | Johnson et al. |
| 2012/0322239 A1 | 12/2012 | Singh et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |
| 2013/0230973 A1 | 9/2013 | Gauldin et al. |
| 2013/0230974 A1 | 9/2013 | Martinez et al. |
| 2013/0344683 A1 | 12/2013 | Lazerand et al. |
| 2014/0235034 A1 | 8/2014 | Pays-Volard et al. |
| 2014/0242780 A1 | 8/2014 | Gauldin et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May, 31, 2011 24 pgs.

Ouye, et al., U.S. Appl. No. 14/109,808 entitled "Actively-Cooled Shadow Ring for Heat Dissipation in Plasma Chamber," filed Dec. 17, 2013, 66 pgs.

Ouye, et al., U.S. Appl. No. 14/109,820 entitled "Plasma Thermal Shield for Heat Dissipation in Plasma Chamber," filed Dec. 17, 2013, 67 pgs.

Lei, et al., U.S. Appl. No. 14/158,529 entitled "Laser and Plasma Etch Wafer Dicing With Etch Chamber Shield Ring for Film Frame Wafer Applications," filed Jan. 17, 2014, 38 pgs.

Ouye, Alan Hiroshi, U.S. Appl. No. 14/169,356 entitled "Cooled Tape Frame Lift and Low Contact Shadow Ring for Plasma Heat Isolation," filed Jan. 31, 2014, 81 pgs.

Nangoy, Roy et al., PCT Patent Application No. PCT/US2014/023770 entitled "Multi Zone Heating and Cooling ESC for Plasma Process Chamber," filed Mar. 11, 2014, 23 pgs.

Lei, et al., U.S. Appl. No. 14/276,683 entitled "Dicing Tape Thermal Management by Wafer Frame Support Ring Cooling During Plasma Dicing," filed May 13, 2014, 74 pgs.

Nangoy, Roy C., "Cooling Pedestal for Dicing Tape Thermal Management During Plasma Dicing," U.S. Appl. No. 14/286,424, filed May 23, 2014, 77 pgs.

Johnson, et al., U.S. Appl. No. 61/452,450, entitled "Apparatus for Plasma Dicing a Semi-Conductor Wafer," filed Mar. 14, 2011, 36 pgs.

\* cited by examiner

STATIONARY ACTIVELY-COOLED SHADOW RING FOR HEAT DISSIPATION IN PLASMA CHAMBER

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a plasma processing apparatus includes a processing chamber having a chamber wall. The plasma processing apparatus also includes a plasma source in an upper portion of the processing chamber. A sample support is included for situating a sample below the plasma source. An actively-cooled shadow ring having a cooling channel therein for cooling fluid transport is fixedly attached to the chamber wall of the processing chamber, between the plasma source and the sample support.

In another embodiment, a method of plasma processing a sample involves introducing a substrate carrier having a substrate thereon into a plasma processing chamber. The plasma processing chamber has a plasma source in an upper portion of the processing chamber. The method also involves placing the substrate carrier on a cathode positioned at a lower sample receiving position. The method also involves moving the cathode to an upper sample processing position to situate the substrate carrier below an actively-cooled shadow ring. The actively-cooled shadow ring is fixedly attached to a chamber wall of the plasma processing chamber and is positioned between the upper sample processing position and the plasma source. The method also involves plasma processing the substrate on the substrate carrier. The actively-cooled shadow ring protects at least a portion of the substrate carrier during the plasma processing.

In another embodiment, a method of dicing a semiconductor wafer having a plurality of integrated circuits involves introducing a substrate supported by a substrate carrier into a plasma etch chamber. The substrate has a patterned mask thereon covering integrated circuits and exposing streets of the substrate. The method also involves situating the substrate carrier below a shadow ring having a cooling channel therein. The shadow ring is fixedly attached to a chamber wall of the plasma etch chamber. The method also involves plasma etching the substrate through the streets to singulate the integrated circuits. The shadow ring shields the substrate carrier from the plasma etching, and a cooling fluid is transported through the cooling channel of the shadow ring during the plasma etching.

DETAILED DESCRIPTION

Figure 1:
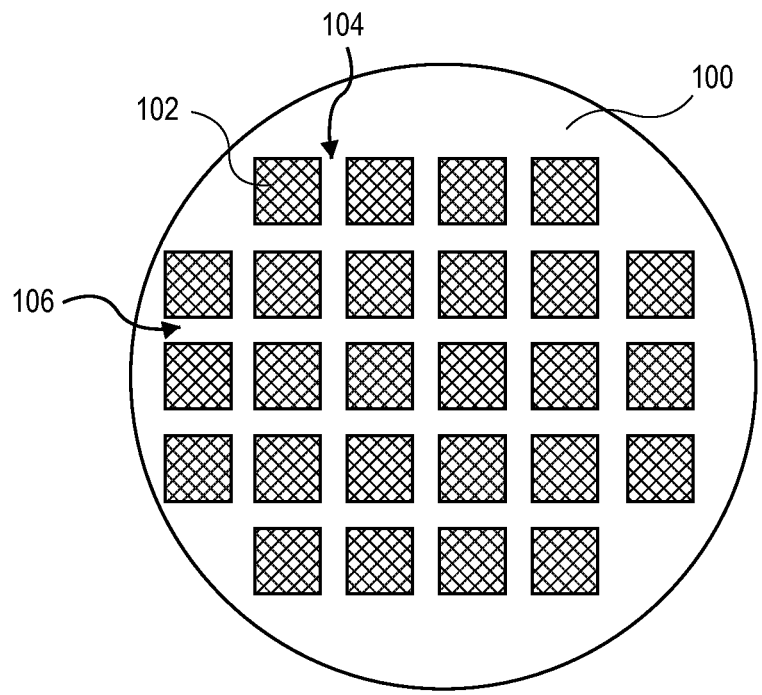
FIG. 1 illustrates a top plan of a semiconductor wafer to be diced, in accordance with an embodiment of the present invention.

Methods of and apparatuses for dicing semiconductor wafers, each wafer having a plurality of integrated circuits thereon, are described. In the following description, numerous specific details are set forth, such as substrate carriers for thin wafers, and scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to a stationary actively-cooled shadow ring for heat dissipation in a plasma etch chamber. Embodiments may include plasmas and plasma based processes, thermal management, active cooling, and heat dissipation. One or more embodiments described herein are directed to a plasma thermal shield compatible with the stationary actively-cooled shadow ring. Embodiments may include plasmas and plasma based processes, thermal management, shielding of plasma generated species, and heat dissipation. Applications for the stationary actively-cooled shadow ring may include die singulation but other high power etch processes or differentiated etch chemistries may benefit from embodiments described herein. In particular embodiments, an etch chamber (such as a single or dual plasma etch chamber) includes a movable or moving cathode and a temperature control process kit for enabling processing of tape frame wafer apparatus.

To provide context, dry plasma etch processing for die singulation on a tape frame wafer is typically performed in a vacuum chamber equipped with a cathode/electrostatic chuck (ESC), a lift mechanism, a gas delivery mechanism, pump pressure control and a shadow ring. The tape frame wafer is used for die singulation processing during which the wafer is attached on top of a flexible tape and metal frame for handling. The tape frame wafer is commonly used in wafer dicing with a wet grinding wheel within a near room temperature environment. In plasma dicing, however, the tape frame wafer is processed inside an etch chamber by using dry plasma etching to cut a silicon wafer into individual dies. During plasma etching, heat is introduced through plasma energy into the wafer and tape and frame. Backside helium cooling and together with the ESC on the top surface of cathode provides at least some control of the tape frame wafer temperature. One concern, however, is that too much heat introduced into the tape will cause the tape to lose its flexibility or burn. Thus, the temperature of tape frame wafer has to be controlled closely during processing. For further temperature control, a shadow ring with an approximately wafer sized opening is placed concentric with the wafer center. Both the tape and the frame are covered by the shadow ring to protect from being etched and to reduce the heating to the tape.

However, in practice, even with the above described temperature control in place, the tape frame wafer often experiences only insufficient cooling that can cause the tape to start cracking or burning. In addition to reducing the cathode temperature to a much lower setting, a shadow ring that covers tape frame can also be actively cooled down with a liquid coolant flow and chiller apparatus. Complexity of such an active cooling shadow ring design has been considered in many ways. One approach is to add cooling lines and hoses into a state-of-the-art movable shadow ring. However, this may be associated with a weak lift motor and tiny shaft and requires cooling hose flexibility. By contrast, in accordance with one or more embodiments described herein, a processing chamber is arranged with a cathode design that accommodates a stationary active cooling shadow ring. Such an arrangement may be implemented to address top side tape frame wafer cooling during processing.

In a specific embodiment, as described in greater detail below, an etch chamber has a lower chamber for wafer transfer and a stationary upper chamber for plasma etching process. The lower chamber can include a slit valve, a moving cathode/ESC and lift mechanism. The upper chamber can include a gas distribution cover, pump pressure control, an RF power source and actively cooled shadow ring. A tape frame wafer may be transferred to the cathode/ESC by a robot blade through the slit valve on the lower chamber. The robot blade is retracted and the slit valve is closed in order to allow further pumping (pressure reduction) to a base pressure. The moving cathode and tape frame wafer is raised up against the bottom of the upper chamber (also referred to as the upper portion of the chamber). The upper chamber is thus isolated from the lower chamber and, as such, plasma etching may be initiated. The actively-cooled shadow ring is fixedly attached to part of the upper chamber and, this, is stationary. Implementation of such a stationary actively-cooled shadow ring may be advantageous in that the design simplifies the requirement on the associated cooling hoses and channels.

In another aspect, a hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In one embodiment, a stationary actively-cooled shadow ring is implemented during the etch portion of the dicing process. In an embodiment, the wafer or substrate is supported by a substrate carrier during the singulation process, including during the etch portion of the singulation process.

In accordance with an embodiment of the present invention, described herein are one or more apparatuses for, and methods of, protecting a substrate carrier composed of thin wafer tape and a tape frame during plasma etch in a singulation process. For example, an apparatus may be used to support and protect the film and film frame used to hold a thin silicon wafer from etch gases. The manufacturing processes related to integrated circuit (IC) packaging may require that a thinned silicon wafer be supported and mounted on a film such as a die attach film. In one embodiment, a die attach film is also supported by a substrate carrier and is used to adhere a thin silicon wafer to the substrate carrier.

To provide context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
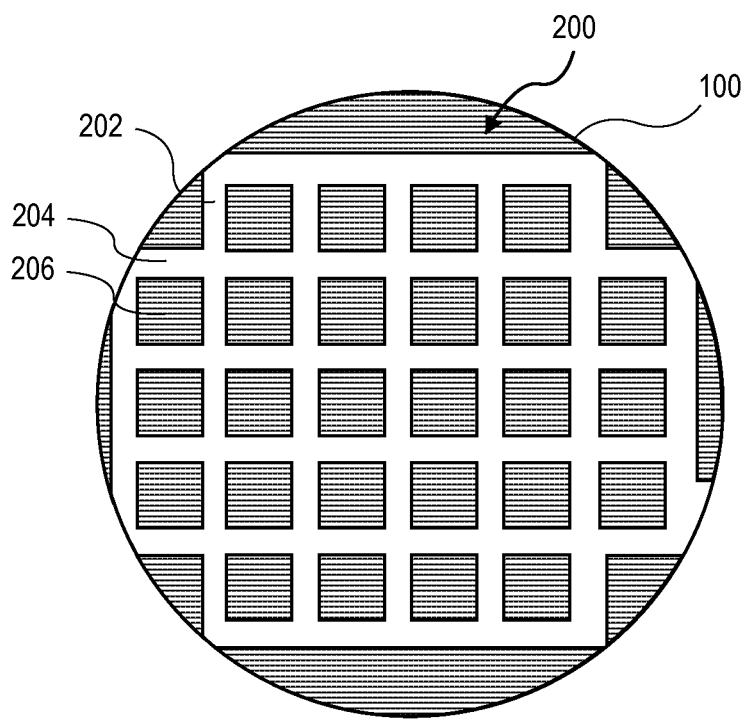
FIG. 2 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dies are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are, in one embodiment, patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100. In accordance with an embodiment of the present invention, a stationary actively-cooled shadow ring is implemented during the etch portion of the dicing process.

As mentioned briefly above, a substrate for dicing is supported by a substrate carrier during the plasma etching portion of a die singulation process, e.g., of a hybrid laser ablation and plasma etching singulation scheme. For example, FIG. 3 illustrates a plan view of a substrate carrier suitable for supporting a wafer during a singulation process, in accordance with an embodiment of the present invention.

Figure 3:
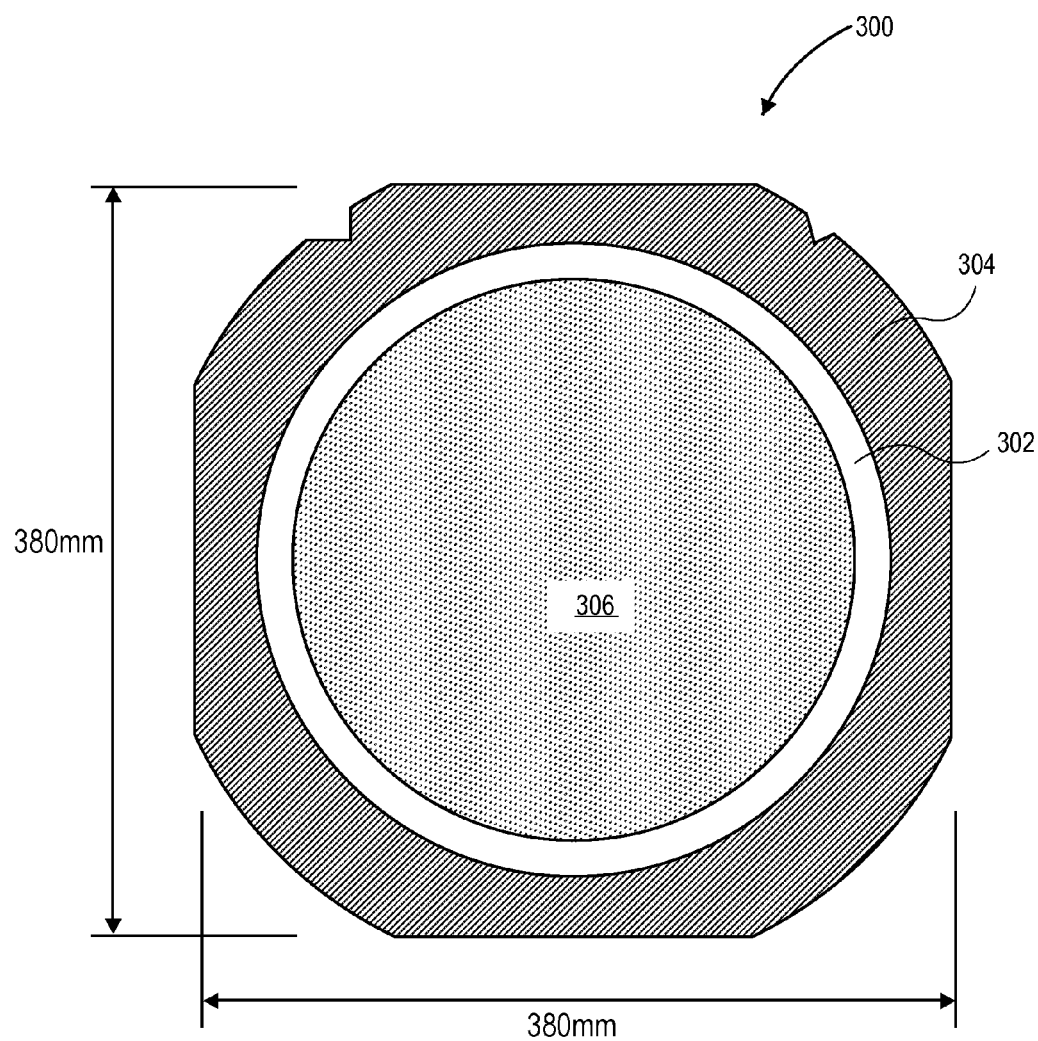
FIG. 3 illustrates a plan view of a substrate carrier suitable for supporting a wafer during a singulation process, in accordance with an embodiment of the present invention.

Referring to FIG. 3, a substrate carrier 300 includes a layer of backing tape 302 surrounded by a tape ring or frame 304. A wafer or substrate 306 is supported by the backing tape 302 of the substrate carrier 300. In one embodiment, the wafer or substrate 306 is attached to the backing tape 302 by a die attach film. In one embodiment, the tape ring 304 is composed of stainless steel.

In an embodiment, a singulation process can be accommodated in a system sized to receive a substrate carrier such as the substrate carrier 300. In one such embodiment, a system such as system 1200, described in greater detail below, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 3. However, it is to be appreciated that systems may be designed to handle 450 millimeter wafers or substrate or, more particularly, 450 millimeter wafer or substrate carriers.

In an aspect of the present invention, a substrate carrier is accommodated in an etch chamber during a singulation process. In an embodiment, the assembly including a wafer or substrate on the substrate carrier is subjected to a plasma etch reactor without affecting (e.g., etching) the film frame (e.g., tape ring 304) and the film (e.g., backing tape 302). In one such embodiment, a stationary actively-cooled shadow ring is implemented during the etch portion of the dicing process. In an example, FIG. 4 illustrates the substrate carrier of FIG. 3 with an overlying stationary actively-cooled shadow ring, in accordance with an embodiment of the present invention.

Figure 4:
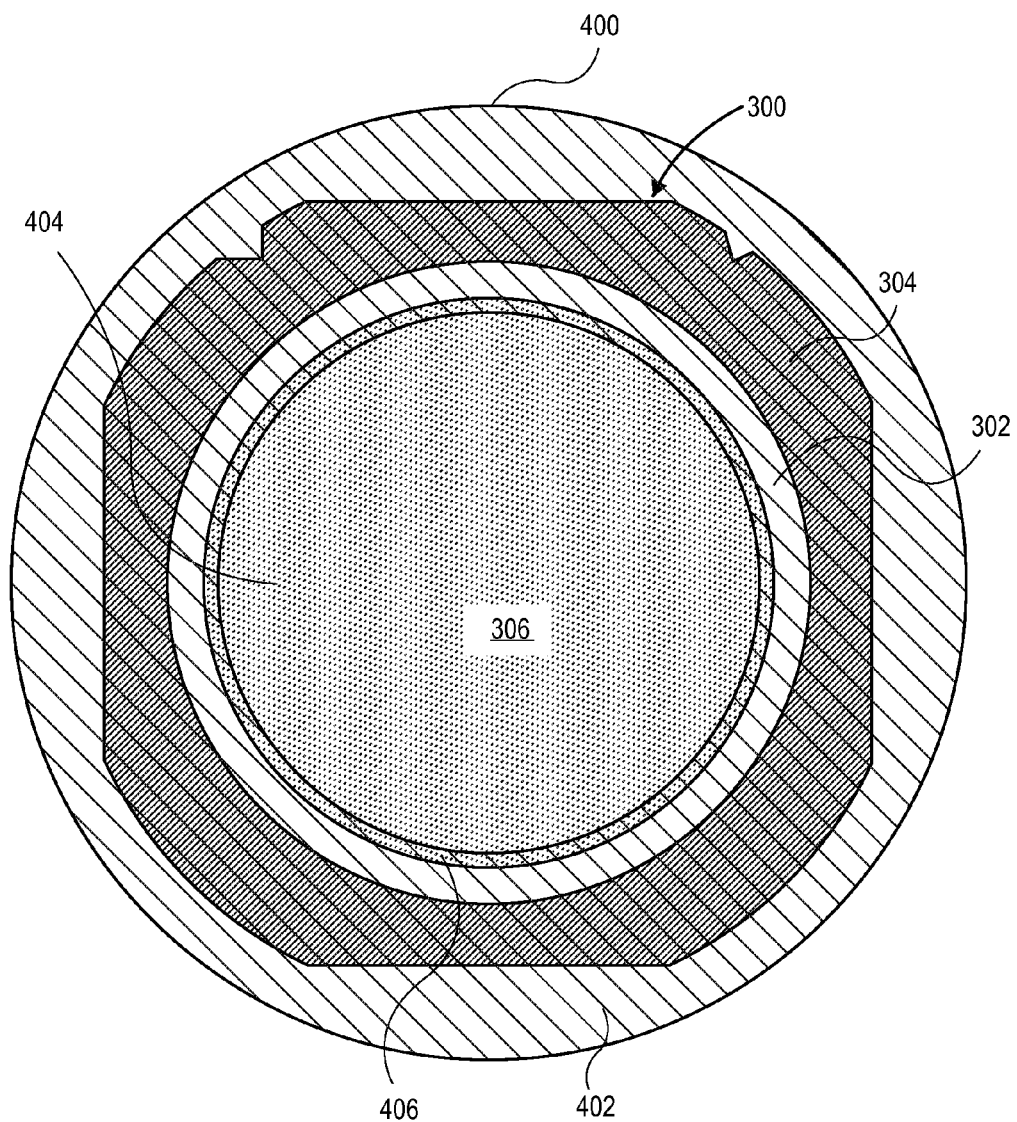
FIG. 4 illustrates the substrate carrier of FIG. 3 with an overlying stationary actively-cooled shadow ring or a plasma thermal shield, or both, in accordance with an embodiment of the present invention.

Referring to FIG. 4, the substrate carrier 300, including the layer of backing tape 302 and tape ring or frame 304 is covered, in a top view perspective, by a stationary actively-cooled shadow ring 400. The stationary actively-cooled shadow ring 400 includes a ring portion 402 and inner opening 404. In one embodiment, a portion of the supported wafer or substrate 306 is also covered by the stationary actively-cooled shadow ring 400 (specifically, portion 406 of the stationary actively-cooled shadow ring 400 covers a portion of the wafer or substrate 306). In a specific such embodiment, the portion 406 of the stationary actively-cooled shadow ring 400 covers approximately 1-1.5 mm of the outer most portion of the wafer or substrate 306. The portion covered may be referred to as the exclusion region of the wafer or substrate 306 since this area is effectively shielded from a plasma process.

A stationary actively-cooled shadow ring for heat dissipation in a plasma chamber is now described in greater detail. In an embodiment, a stationary actively-cooled shadow ring can be implemented to reduce a temperature of a process kit shadow ring during processing of a wafer supported by a wafer carrier. By reducing the temperature of a shadow ring, damage or burning of a die singulation tape that otherwise occurs at elevated temperatures may be mitigated. For example, a damaged or burned die singulation tape normally leads to the wafer or substrate as not being recoverable. Furthermore, the attached tape can become damaged when the tape frame reaches an elevated temperature. Although described herein in the context of tape and frame protection during etch processing for die singulation, use of a stationary actively-cooled shadow ring can provide other process benefits including an increase in throughput. For example, temperature reduction may otherwise be achieved by easing of process conditions such as RF power reduction, but this requires an increase in process time which is detrimental to throughput. Other advantages may include ease of handling of the shadow ring which is stationary (fixedly attached) within the chamber, reducing potential damage to the shadow ring as compared with a moveable shadow ring.

Figure 5A:
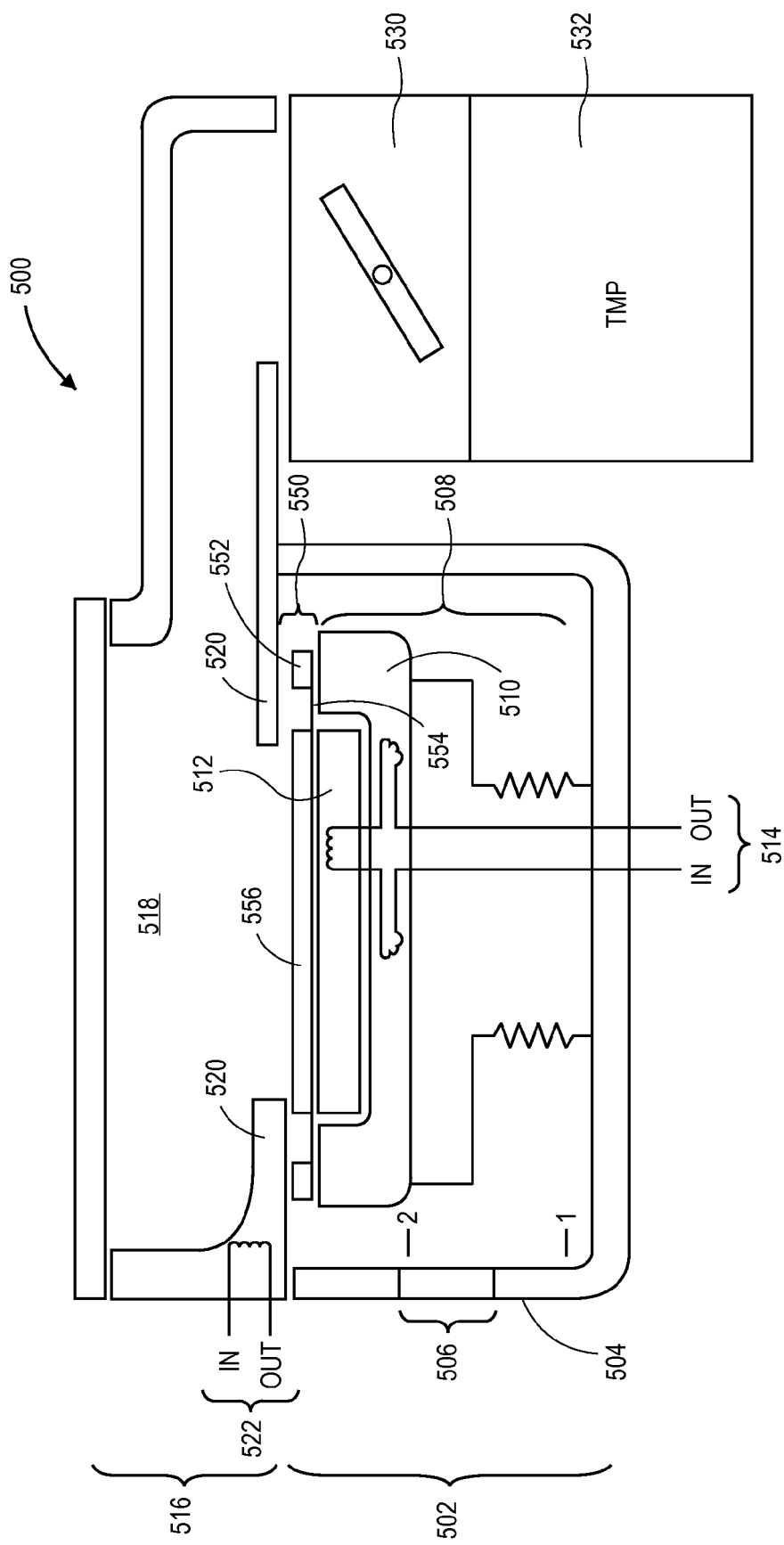
FIG. 5A illustrates a cross-sectional view of a plasma processing chamber having a stationary actively-cooled shadow ring, in accordance with an embodiment of the present invention.

FIG. 5A illustrates a cross-sectional view of a plasma processing chamber having a stationary actively-cooled shadow ring, in accordance with an embodiment of the present invention.

Referring to FIG. 5A, a plasma processing chamber 500 includes a lower portion 502 (also referred to as lower chamber) with a chamber wall 504 having a slit valve 506 therein. The slit valve 506 may be opened for wafer or substrate carrier introduction or removal to the chamber 500, and may be closed during processing. A movable cathode 508 is movable between position 1 and position 2. In an example, the movable cathode 508 receives a sample at position 1 and is then moved to position 2 where the sample is positioned during processing. A support portion 510 of the movable cathode 508 includes or houses an electrostatic chuck (ESC) 512. The ESC 512 may be coupled to the support portion 510 of the movable cathode 508 either directly or by an insulating layer. A cooling channel 514 (shown generically in FIG. 5A) is included for the support portion 510 of the movable cathode 508. The cooling channel 514 may run through the ESC 512 as well and, as such, cooling channels of the cathode and the ESC 512 may be in series.

Referring again to FIG. 5A, the plasma processing chamber 500 further includes an upper portion 516 (also referred to as upper chamber). The upper portion 516 of chamber 500 includes a plasma source 518 above position 2 (shown generally as a plasma source region since the plasma source may be direct, indirect (remote), dual, may include a showerhead, etc.). The upper portion 516 of chamber 500 further includes a stationary shadow ring 520 between the plasma source 518 and position 2 of the movable cathode 508. The stationary shadow ring 520 may be coupled to a wall of the chamber 500, as described in greater detail in association with FIG. 5B. The stationary shadow ring 520 has one or more cooling channels 522 therein (shown generically in FIG. 5A). In an embodiment, such an actively-cooled shadow ring does not contact the substrate or substrate carrier during plasma processing, as is depicted in FIG. 5A. However, in another embodiment, the actively-cooled shadow ring is in contact with the substrate carrier frame but not the substrate during plasma processing, effectively sealing off the lower chamber portion 502 from the upper chamber portion 516. The cooling channels 522 of the stationary shadow ring 520 may, in one embodiment, be independent from the cooling channel 514. In another embodiment, however, the cooling channels 522 are in series with the cooling channel 514.

In an embodiment, the cooling channel 522 enables continual flow of a cooling fluid or gas through the actively-cooled shadow ring 520 during plasma processing. In a specific embodiment, the cooling channel 522 travels essentially the entire mid-circumference of an annular body portion of the actively-cooled shadow ring 520 (the annular body portion is highlighted in FIG. 5B, described below). In an embodiment, the plasma processing chamber 500 is a plasma etch processing chamber, and the cooling channel 522 of the actively-cooled shadow ring 520 is configured to reduce a temperature of an annular body portion of the actively-cooled shadow ring 520 from a temperature greater than 260 degrees Celsius to less than 120 degrees Celsius during plasma etch processing. In an embodiment, the chamber 500 is further associated with a chiller which is coupled to the cooling channel 522 by cooling fluid lines. In one such embodiments, the chiller is for cooling a cooling fluid outside of the processing chamber 500.

In an embodiment, the ability to enable such continual flow of a cooling fluid or gas can provide superior temperature control of the stationary shadow ring 520 which enables temperature control (e.g., reduced temperature exposure) of the tape frame and tape of a substrate carrier clamped to, or situated below the actively-cooled shadow ring 520. This protection of the tape frame and tape is in addition to the protection provided by physically blocking the plasma from reaching the tape frame and tape of the substrate or wafer carrier. The fluid-channeled shadow ring, referred to herein as actively-cooled shadow ring 520, is distinguished from passively cooled shadow rings that may merely be cooled by contact with a heat sink or a cooled chamber wall.

The heat transfer liquid may be any employed in the art, for example an anti-freeze or a perfluoropolyether known under the trade names of Fluorinert (3M, Inc.) or Galden (Solvey Solexis, Inc), e.g., Galden HT135 for operation in the range of 0° C.-20° C. In another embodiment a cooling gas such as He is run through the cooling channel 522.

Referring again to FIG. 5A, a substrate carrier 550 is shown in position for processing on the movable cathode 508 and the ESC 512. The substrate carrier 550 includes, in one embodiment, a tape frame 552, supporting or dicing tape 554, and a sample wafer or substrate 556. Also shown are a throttle valve 530 and turbo molecular pump 532 that may be included as coupled to the chamber 500. Also, the top wall (or ceiling) of the upper portion 516 of the chamber 500 may be or include a gas distribution cover. Although not depicted, the chamber 500 can also include one or more of a pump pressure control and an RF power source.

Thus, referring generally to FIG. 5A, in accordance with an embodiment of the present invention, a plasma processing apparatus includes a processing chamber having a chamber wall. The plasma processing apparatus also includes a plasma source in an upper portion of the processing chamber. A sample support is included for situating a sample below the plasma source. An actively-cooled shadow ring having a cooling channel therein for cooling fluid transport is fixedly attached to a chamber wall of the processing chamber, between the plasma source and the sample support. In one such embodiment, the sample support is or includes a movable cathode. In a specific such embodiment, the sample support further includes an electrostatic chuck coupled to the movable cathode. Thus, in an embodiment, a substrate carrier is held on a movable cathode with an electrostatic chuck coupled to the cathode. In one embodiment, the electrostatic chuck is for supporting a sample region of a dicing tape of a substrate carrier (i.e., the region of the tape directly below a substrate or wafer). Meanwhile, the movable cathode is for supporting a tape frame region of the dicing tape of the substrate carrier (i.e., the region of the tape directly below the tape frame).

Figure 5B:
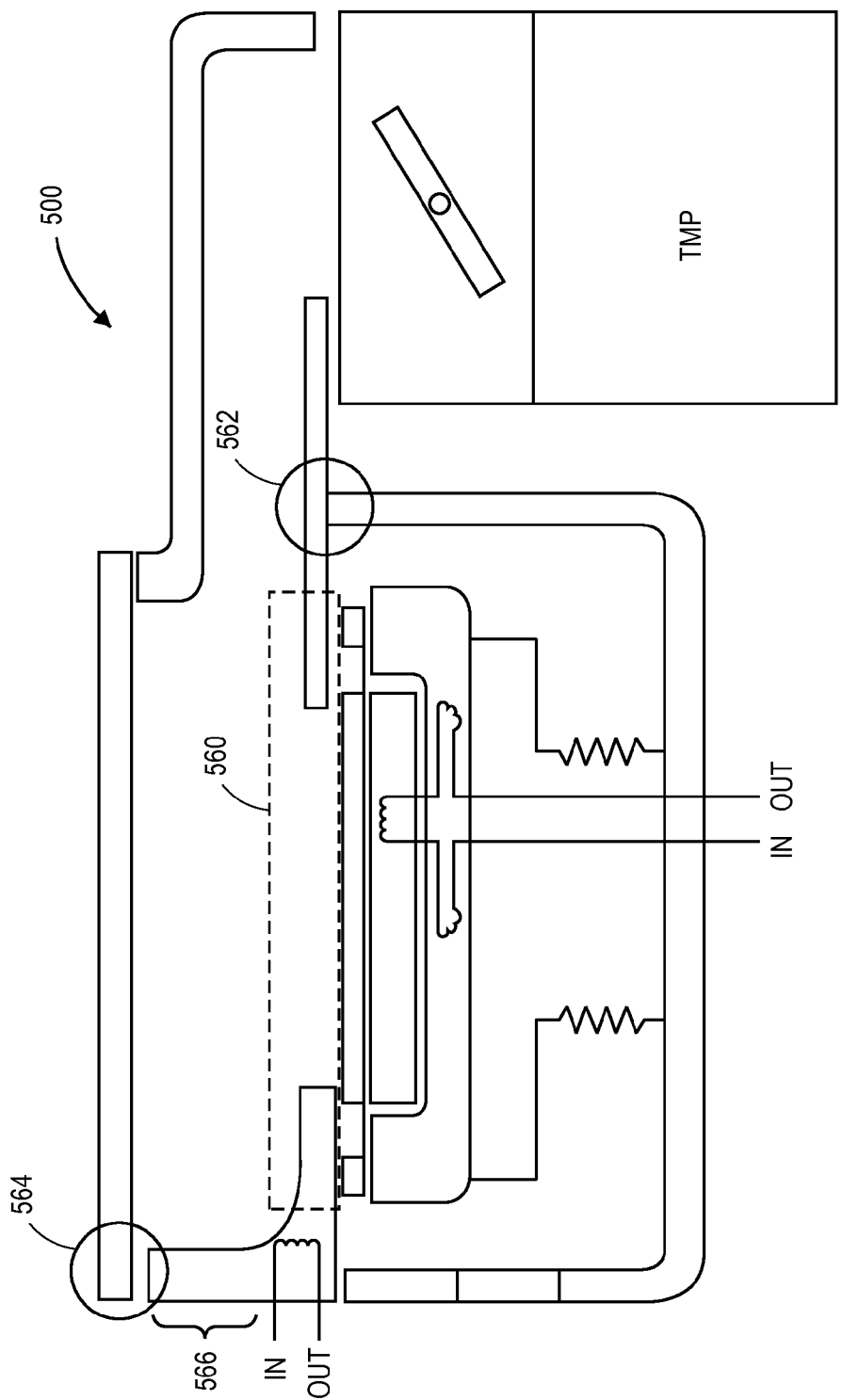
FIG. 5B illustrates the plasma processing chamber of FIG. 5A showing possible locations for fixedly attaching the stationary actively-cooled shadow ring within the plasma processing chamber, in accordance with an embodiment of the present invention.

FIG. 5B illustrates the plasma processing chamber of FIG. 5A showing possible locations for fixedly attaching the stationary actively-cooled shadow ring within the plasma processing chamber, in accordance with an embodiment of the present invention. Referring to FIG. 5B, the actively cooled shadow ring may be fixedly attached to a chamber wall (horizontal or vertical chamber wall) at one or more of points 562, 564 or 566. In one embodiment, the actively cooled shadow ring has an annular portion body. The annular portion or body is shown as a plan view in association with FIG. 4; in FIG. 5A, a cross-sectional view of the annular portion is highlighted by dashed box 560. It is to be appreciated that the cooling channel 522 can, in an embodiment, run through the entire annular portion of the shadow ring (e.g., at a mid-circumference of the annular portion), although in FIG. 5B the channel is only depicted on the left side of the cross-sectional view.

In an embodiment, then, the actively-cooled shadow ring 520 has an annular body portion with an inner opening sized to expose, from a top-down perspective, at least a portion of substrate processing region. In one embodiment, the actively-cooled shadow ring 520 has an annular body portion with an inner opening sized to expose, from a top-down perspective, a portion of but not all of the substrate processing region of the sample support to the plasma source of the plasma processing chamber during plasma processing. In one embodiment, the annular body portion of the actively-cooled shadow ring is composed of aluminum having a hard anodized surface or a ceramic coating.

Referring again to FIG. 5A, in contrast to a movable actively-cooled shadow ring which requires a mechanism for lifting, the stationary shadow ring 520 is fixedly attached to a chamber wall. A sample enters the process chamber and is placed on a movable cathode at a lower position. The movable cathode is then raised to an upper position for sample processing within the chamber.

In accordance with an embodiment of the present invention, then, a method of plasma processing a sample involves introducing a substrate carrier 550 having a substrate 556 thereon into a plasma processing chamber 500. The plasma processing chamber 500 has a plasma source 518 in an upper portion 516 of the plasma processing chamber 500. The method also involves placing the substrate carrier 550 on a cathode 508 positioned at a lower sample receiving position (position 1). The method also involves moving the cathode 508 to an upper sample processing position (position 2) to situate the substrate carrier 508 below an actively-cooled shadow ring 520. The actively-cooled shadow ring 520 is fixedly attached to a chamber wall of the plasma processing chamber 500 and is positioned between the upper sample processing position (position 2) and the plasma source 518. The method also involves plasma processing the substrate 556 on the substrate carrier 550. The actively-cooled shadow ring 520 protects at least a portion of the substrate carrier 550 during the plasma processing.

In one embodiment, the method further involves, subsequent to plasma processing the substrate 556, moving the cathode 508 to the lower sample receiving position (position 1), and removing the substrate carrier 550 from the plasma processing chamber 500. In one such embodiment, introducing the substrate carrier 550 into the plasma processing chamber 500 involves introducing the substrate carrier 550 through a slit valve 506 of the plasma processing chamber 500. Removing the substrate carrier 550 from the plasma processing chamber 500 involves removing the substrate carrier 550 through the same slit valve 506 of the plasma processing chamber 500.

More generally, it is to be appreciated that during plasma etching processes, the temperature of wafer is typically controlled by the electrostatic chuck. The wafer shield ring acts as a thermal barrier to the frame and tape pairing. However, depending on the specific tape and etching process recipe (particularly process time) employed in a given application, the wafer shield ring may be not sufficient to block the heat from transfer to the frame and tape beneath it. In such a case, the tape and/or frame can become over-heated as to either cause tape damage or delamination of tape from frame or reduction of adhesion between tape and frame. Such damage of tape between the frame and wafer can cause the failure of the etch process and lead to wafer damage. The delamination of tape from the frame is another critical dicing failure. The reduction of adhesion between tape and frame can, for example, cause tape to peel off from the frame during tape expansion operation used for die pick. In an embodiment, cooling of the tape and frame with the stationary actively-cooled shadow ring 520 is performed during etch processing in order to avoid potential tape damage/degradation.

In an aspect of the present invention, an etch reactor is configured to accommodate etching of a thin wafer or substrate supported by a substrate carrier. For example, FIG. 6 illustrates a cross-sectional view of an etch reactor, in accordance with an embodiment of the present invention.

Figure 6:
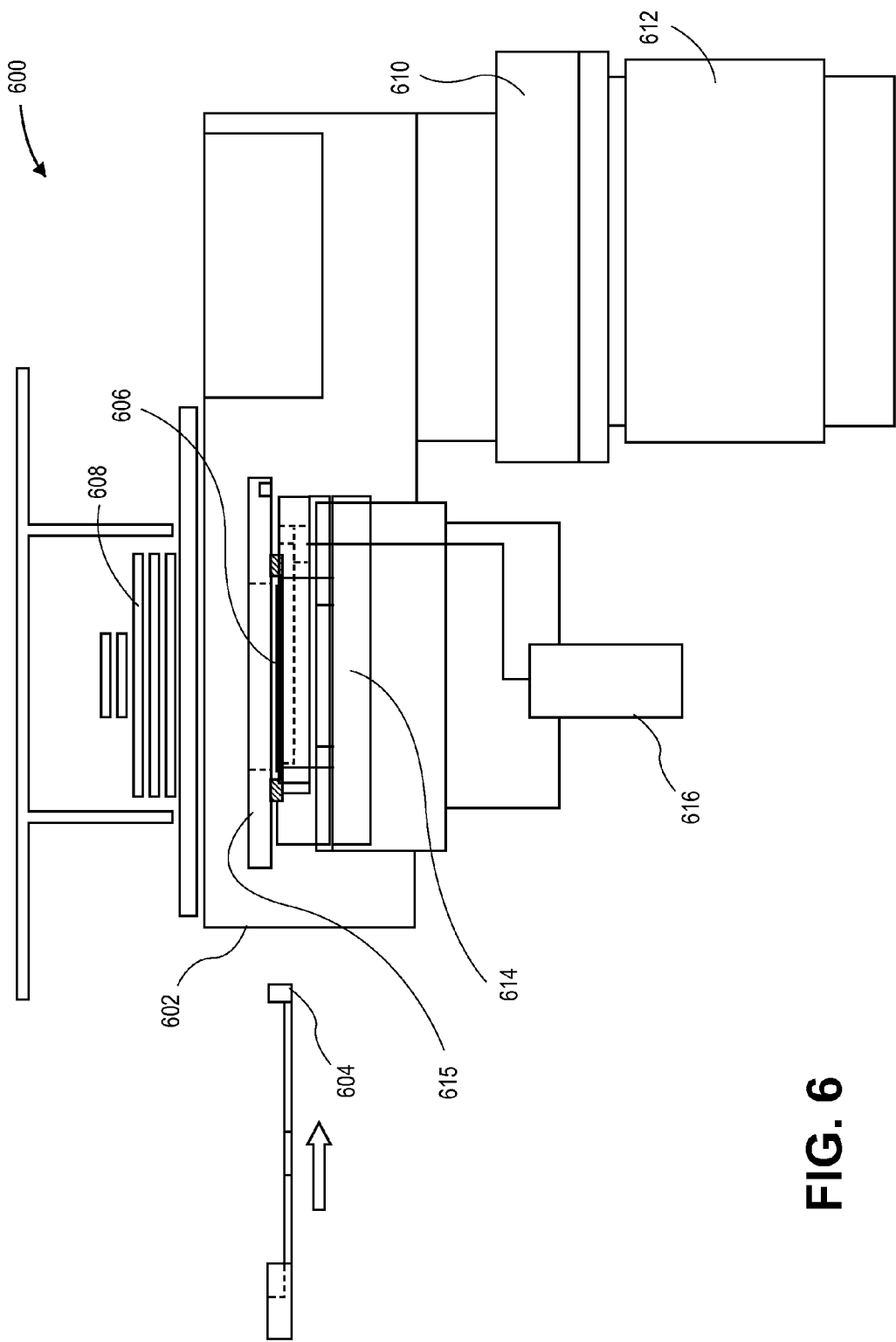
FIG. 6 illustrates a cross-sectional view of an etch reactor, in accordance with an embodiment of the present invention.

Referring to FIG. 6, an etch reactor 600 includes a chamber 602. An end effector 604 is included for transferring a substrate carrier 606 to and from chamber 602, e.g., through a slit valve in a chamber wall. An inductively coupled plasma (ICP) source 608 is positioned in an upper portion of the chamber 602. The chamber 602 is further equipped with a throttle valve 610 and a turbo molecular pump 612. The etch reactor 600 also includes a movable cathode assembly 614 (e.g., an assembly including an etch cathode or etch electrode). A shadow ring assembly 615 is included above the region accommodating the substrate or wafer carrier 606. In an embodiment, the shadow ring assembly 615 is an actively-cooled shadow ring fixedly attached to a chamber wall of the chamber 602, as described in association with FIG. 5B. A cathode actuator 616 may be included for moving the cathode to and from a receiving position and a processing position, as described in association with FIG. 5A.

In an embodiment, the end effector 604 is a robot blade sized for handling a substrate carrier. In one such embodiment, the robotic end effector 604 supports a film frame assembly (e.g., substrate carrier 300) during transfer to and from an etch reactor under sub-atmospheric pressure (vacuum). The end effector 604 includes features to support the substrate carrier in the X-Y-Z axis with gravity-assist. The end effector 604 also includes a feature to calibrate and center the end effector with respect to circular features of a processing tool (e.g., an etch cathode center, or a center of a circular silicon wafer).

In one embodiment, an etch electrode of the cathode assembly 614 is configured to allow RF and thermal coupling with the substrate carrier to enable plasma etching. However, in an embodiment, the etch electrode only contacts a backing tape portion of a substrate carrier and not the frame of the substrate carrier.

Figure 7:
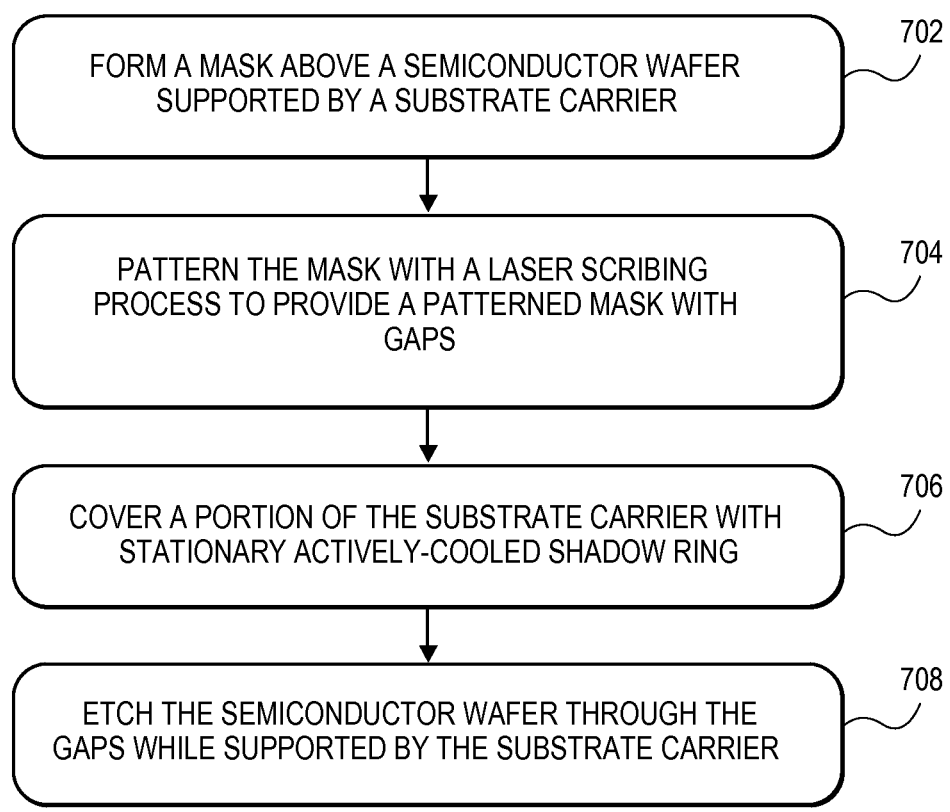
FIG. 7 is a Flowchart representing operations in a method of dicing a semiconductor wafer including a plurality of integrated circuits, in accordance with an embodiment of the present invention.
Figure 8A:
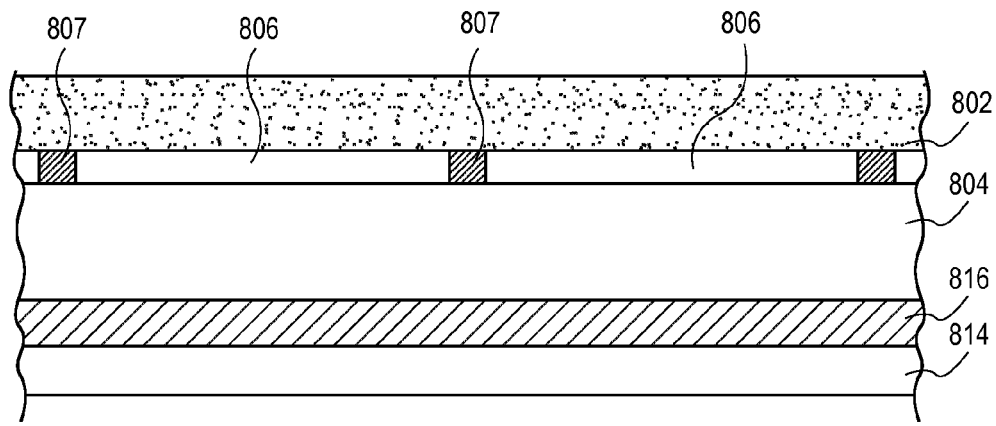
FIG. 8A illustrates a cross-sectional view of a semiconductor wafer including a plurality of integrated circuits during performing of a method of dicing the semiconductor wafer, corresponding to operation 702 of the Flowchart of FIG. 7, in accordance with an embodiment of the present invention.
Figure 8B:
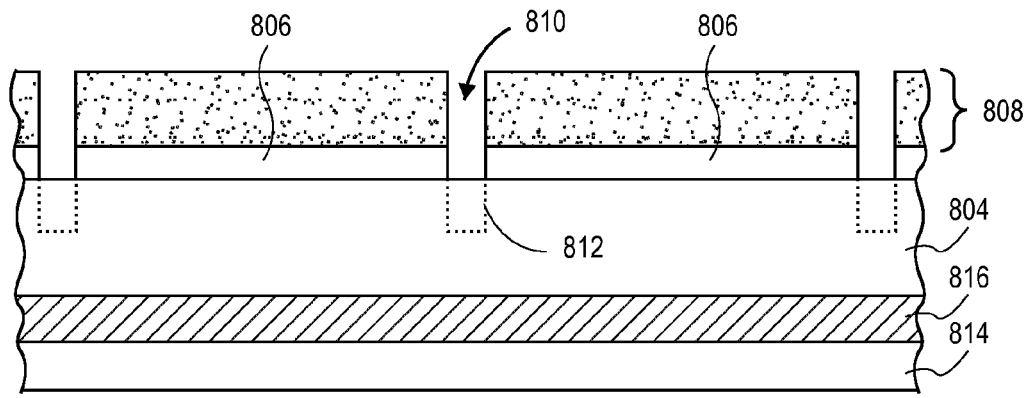
FIG. 8B illustrates a cross-sectional view of a semiconductor wafer including a plurality of integrated circuits during performing of a method of dicing the semiconductor wafer, corresponding to operation 704 of the Flowchart of FIG. 7, in accordance with an embodiment of the present invention.
Figure 8C:
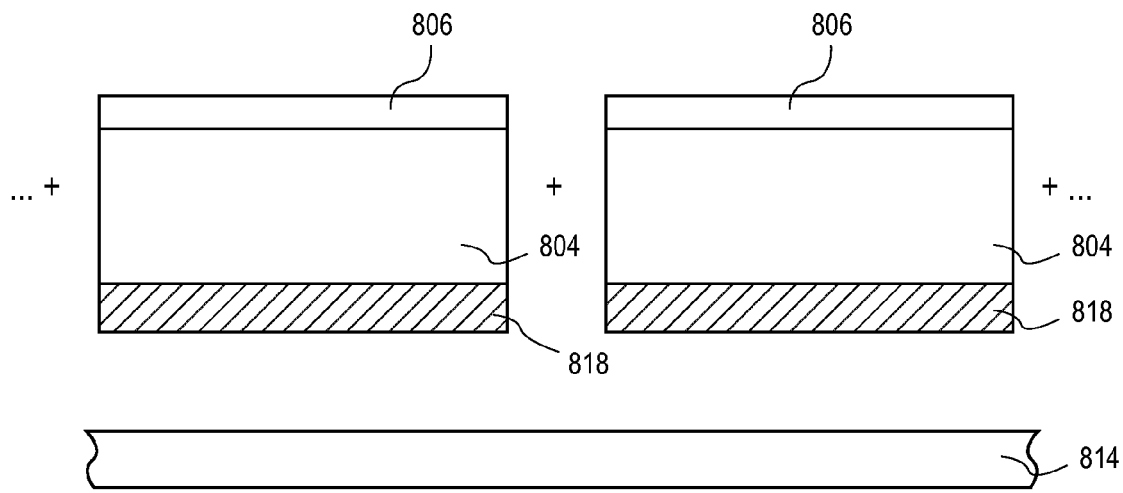
FIG. 8C illustrates a cross-sectional view of a semiconductor wafer including a plurality of integrated circuits during performing of a method of dicing the semiconductor wafer, corresponding to operation 708 of the Flowchart of FIG. 7, in accordance with an embodiment of the present invention.

In another aspect, FIG. 7 is a Flowchart 700 representing operations in a method of dicing a semiconductor wafer including a plurality of integrated circuits, in accordance with an embodiment of the present invention. FIGS. 8A-8C illustrate cross-sectional views of a semiconductor wafer including a plurality of integrated circuits during performing of a method of dicing the semiconductor wafer, corresponding to operations of Flowchart 700, in accordance with an embodiment of the present invention.

Referring to operation 702 of Flowchart 700, and corresponding FIG. 8A, a mask 802 is formed above a semiconductor wafer or substrate 804. The mask 802 is composed of a layer covering and protecting integrated circuits 806 formed on the surface of semiconductor wafer 804. The mask 802 also covers intervening streets 807 formed between each of the integrated circuits 806. The semiconductor wafer or substrate 804 is supported by a substrate carrier 814.

In an embodiment, the substrate carrier 814 includes a layer of backing tape, a portion of which is depicted as 814 in FIG. 8A, surrounded by a tape ring or frame (not shown). In one such embodiment, the semiconductor wafer or substrate 804 is disposed on a die attach film 816 disposed on the substrate carrier 814, as is depicted in FIG. 8A.

In accordance with an embodiment of the present invention, forming the mask 802 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 802 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 802 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 804 is composed of a material suitable to withstand a fabrication process and upon which semiconductor processing layers may suitably be disposed. For example, in one embodiment, semiconductor wafer or substrate 804 is composed of a group IV-based material such as, but not limited to, crystalline silicon, germanium or silicon/germanium. In a specific embodiment, providing semiconductor wafer 804 includes providing a monocrystalline silicon substrate. In a particular embodiment, the monocrystalline silicon substrate is doped with impurity atoms. In another embodiment, semiconductor wafer or substrate 804 is composed of a material such as, e.g., a material substrate used in the fabrication of light emitting diodes (LEDs).

In an embodiment, the semiconductor wafer or substrate 804 has a thickness of approximately 300 microns or less. For example, in one embodiment, a bulk single-crystalline silicon substrate is thinned from the backside prior to being affixed to the die attach film 816. The thinning may be performed by a backside grind process. In one embodiment, the bulk single-crystalline silicon substrate is thinned to a thickness approximately in the range of 50-300 microns. It is important to note that, in an embodiment, the thinning is performed prior to a laser ablation and plasma etch dicing process. In an embodiment, the die attach film 816 (or any suitable substitute capable of bonding a thinned or thin wafer or substrate to the substrate carrier 814) has a thickness of approximately 20 microns.

In an embodiment, the semiconductor wafer or substrate 804 has disposed thereon or therein, as a portion of the integrated circuits 806, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 806. Materials making up the streets 807 may be similar to or the same as those materials used to form the integrated circuits 806. For example, streets 807 may be composed of layers of dielectric materials, semiconductor materials, and metallization. In one embodiment, one or more of the streets 807 includes test devices similar to the actual devices of the integrated circuits 806.

Referring to operation 704 of Flowchart 700, and corresponding FIG. 8B, the mask 802 is patterned with a laser scribing process to provide a patterned mask 808 with gaps 810, exposing regions of the semiconductor wafer or substrate 804 between the integrated circuits 806. In one such embodiment, the laser scribing process is a femtosecond-based laser scribing process. The laser scribing process is used to remove the material of the streets 807 originally formed between the integrated circuits 806. In accordance with an embodiment of the present invention, patterning the mask 802 with the laser scribing process includes forming trenches 812 partially into the regions of the semiconductor wafer 804 between the integrated circuits 806, as is depicted in FIG. 8B.

In an embodiment, patterning the mask 802 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond (10-15 seconds). In one embodiment, ablation is not, or is essentially not, wavelength dependent and is thus suitable for complex films such as films of the mask 802, the streets 807 and, possibly, a portion of the semiconductor wafer or substrate 804.

Figure 9:
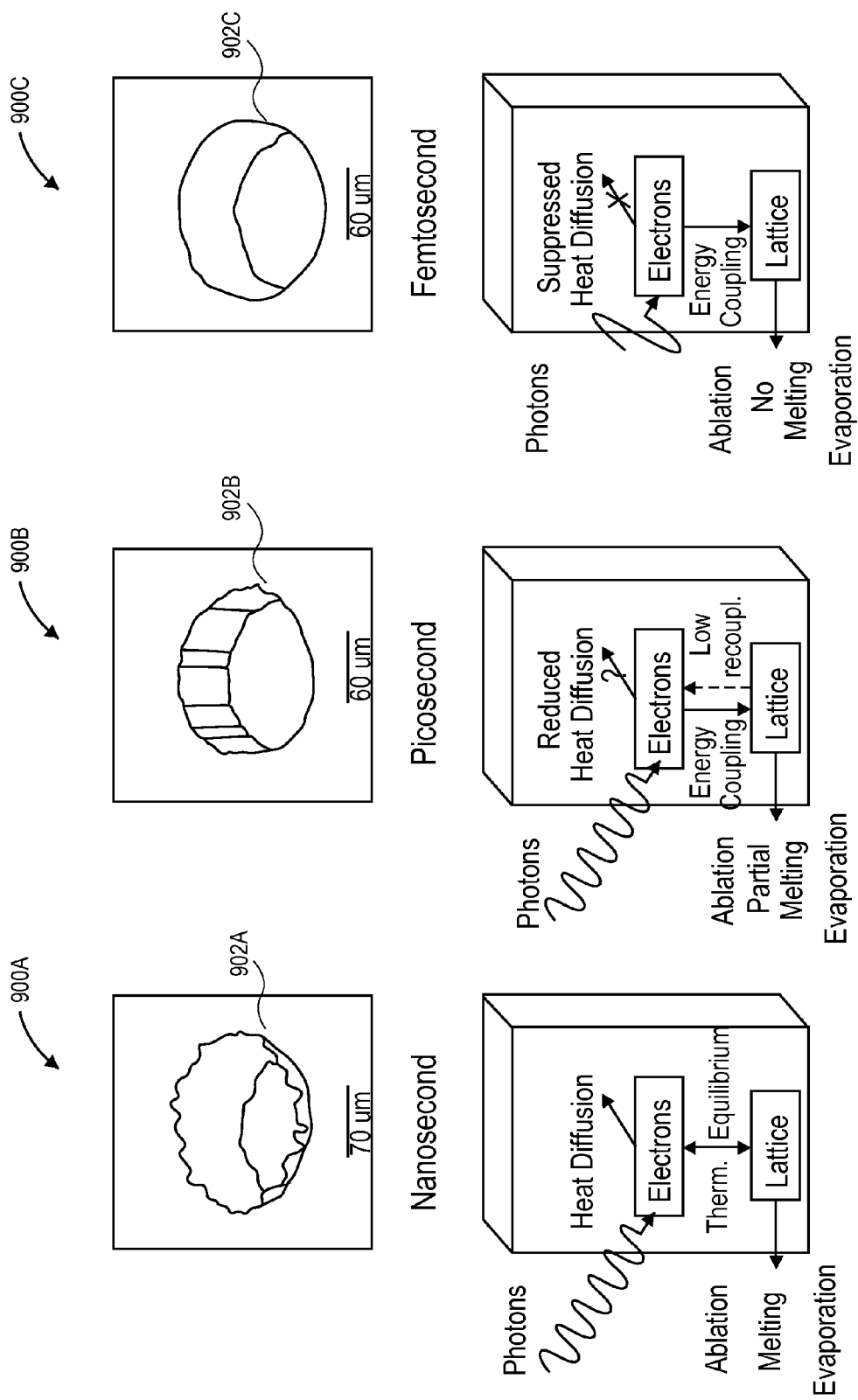
FIG. 9 illustrates the effects of using a laser pulse in the femtosecond range versus longer pulse times, in accordance with an embodiment of the present invention.

FIG. 9 illustrates the effects of using a laser pulse in the femtosecond range versus longer frequencies, in accordance with an embodiment of the present invention. Referring to FIG. 9, by using a laser with a pulse width in the femtosecond range heat damage issues are mitigated or eliminated (e.g., minimal to no damage 902C with femtosecond processing of a via 900C) versus longer pulse widths (e.g., damage 902B with picosecond processing of a via 900B and significant damage 902A with nanosecond processing of a via 900A). The elimination or mitigation of damage during formation of via 900C may be due to a lack of low energy recoupling (as is seen for picosecond-based laser ablation) or thermal equilibrium (as is seen for nanosecond-based laser ablation), as depicted in FIG. 9.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5m/sec, although preferably approximately in the range of 600 mm/sec to 2m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 706 of Flowchart 700, in accordance with an embodiment of the present invention, a portion of the substrate carrier is covered with a stationary actively-cooled shadow ring in preparation for an etch portion of the dicing process. In one embodiment, the stationary actively-cooled shadow ring is fixed attached to a wall of a plasma etching chamber. In one embodiment, the stationary actively-cooled shadow ring leaves exposed a portion of, but not all of, the semiconductor wafer or substrate 804, as described above in association with FIG. 4.

Referring to operation 708 of Flowchart 700, and corresponding FIG. 8C, the semiconductor wafer or substrate 804 is etched through the gaps 810 in the patterned mask 808 to singulate the integrated circuits 806. In accordance with an embodiment of the present invention, etching the semiconductor wafer 804 includes etching to extend the trenches 812 formed with the laser scribing process and to ultimately etch entirely through semiconductor wafer or substrate 804, as depicted in FIG. 8C.

In an embodiment, etching the semiconductor wafer or substrate 804 includes using a plasma etching process. In one embodiment, a through-silicon via type etch process is used. For example, in a specific embodiment, the etch rate of the material of semiconductor wafer or substrate 804 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 804 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In one embodiment, however, a Bosch process is used which involves formation of a scalloped profile.

In an embodiment, singulation may further include patterning of die attach film 816. In one embodiment, die attach film 816 is patterned by a technique such as, but not limited to, laser ablation, dry (plasma) etching or wet etching. In an embodiment, the die attach film 816 is patterned in sequence following the laser scribe and plasma etch portions of the singulation process to provide die attach film portions 818, as depicted in FIG. 8C. In an embodiment, the patterned mask 808 is removed after the laser scribe and plasma etch portions of the singulation process, as is also depicted in FIG. 8C. The patterned mask 808 may be removed prior to, during, or following patterning of the die attach film 816. In an embodiment, the semiconductor wafer or substrate 804 is etched while supported by the substrate carrier 814. In an embodiment, the die attach film 816 is also patterned while disposed on the substrate carrier 814.

Accordingly, referring again to Flowchart 700 and FIGS. 8A-8C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. In one embodiment, a stationary actively-cooled shadow ring is implemented during the etch portion of the dicing process. Additionally, removal of exposed portions of the die attach film may be performed to provide singulated integrated circuits, each having a portion of a die attach film thereon. The individual integrated circuits, including die attach film portions (if applicable) may then be removed from the substrate carrier 814, as depicted in FIG. 8C. In an embodiment, the singulated integrated circuits are removed from the substrate carrier 814 for packaging. In one such embodiment, the patterned die attach film 818 is retained on the backside of each integrated circuit and included in the final packaging. However, in another embodiment, the patterned die attach film 814 is removed during or subsequent to the singulation process.

Referring again to FIGS. 8A-8C, the plurality of integrated circuits 806 may be separated by streets 807 having a width of approximately 10 microns or smaller. The use of a laser scribing approach (such as a femtosecond-based laser scribing approach) may enable such compaction in a layout of integrated circuits, at least in part due to the tight profile control of the laser. For example, FIG. 10 illustrates compaction on a semiconductor wafer or substrate achieved by using narrower streets versus conventional dicing which may be limited to a minimum width, in accordance with an embodiment of the present invention.

Figure 10:
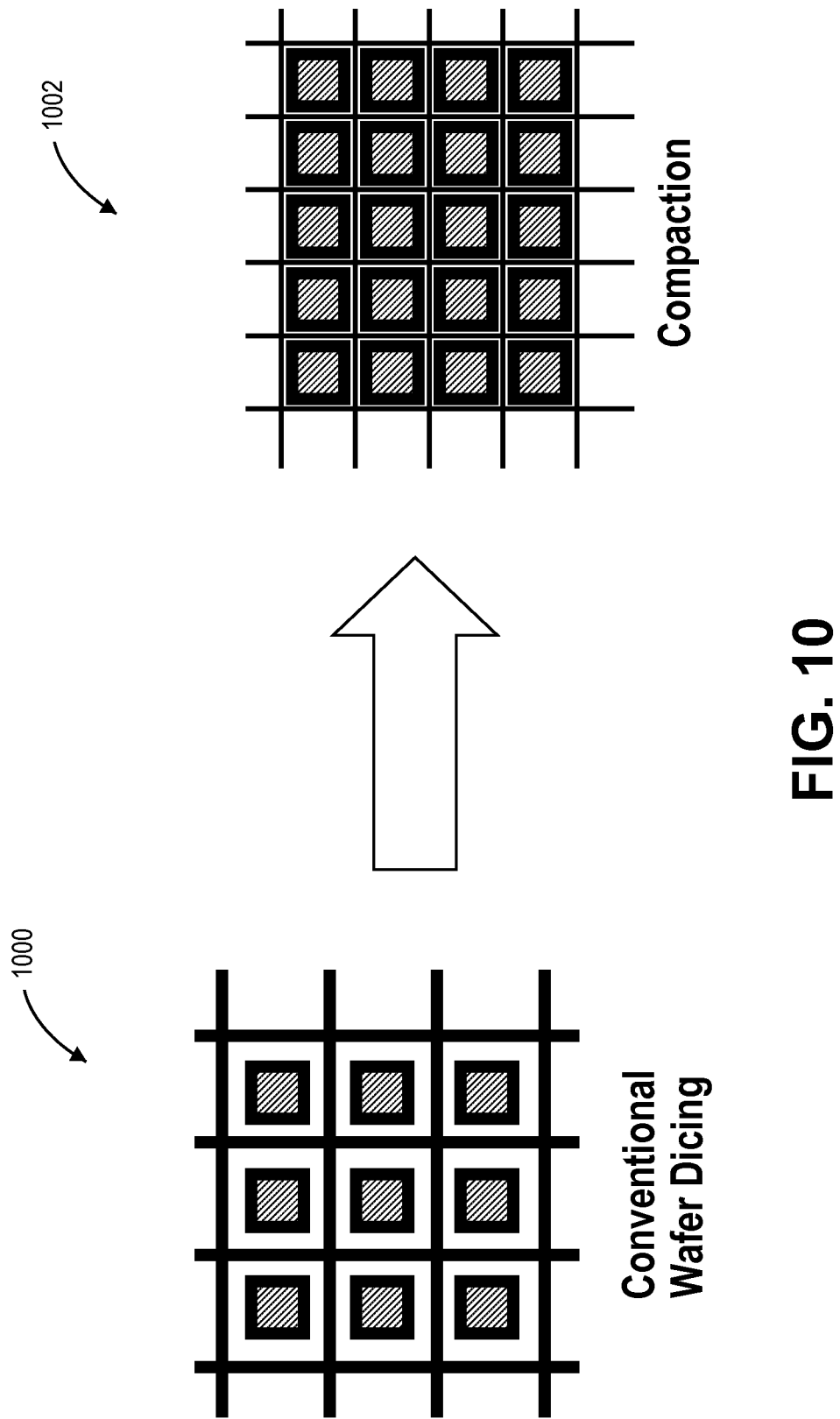
FIG. 10 illustrates compaction on a semiconductor wafer achieved by using narrower streets versus conventional dicing which may be limited to a minimum width, in accordance with an embodiment of the present invention.

Referring to FIG. 10, compaction on a semiconductor wafer is achieved by using narrower streets (e.g., widths of approximately 10 microns or smaller in layout 1002) versus conventional dicing which may be limited to a minimum width (e.g., widths of approximately 70 microns or larger in layout 1000). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 11:
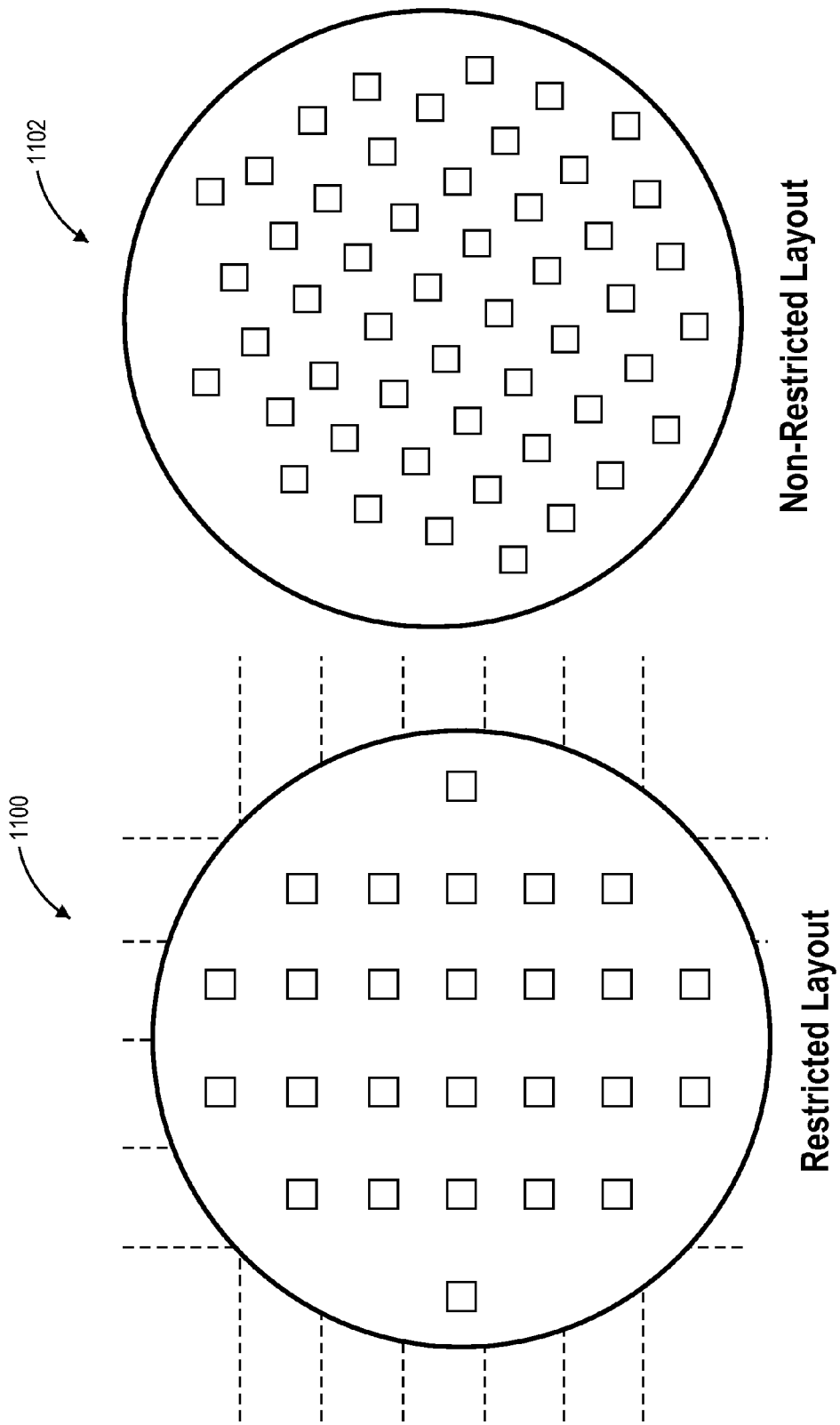
FIG. 11 illustrates freeform integrated circuit arrangement allowing denser packing and, hence, more die per wafer versus grid alignment approaches, in accordance with an embodiment of the present invention.

Referring again to FIGS. 8A-8C, the plurality of integrated circuits 806 may be arranged on semiconductor wafer or substrate 804 in a non-restricted layout. For example, FIG. 11 illustrates a freeform integrated circuit arrangement allowing denser packing. The denser packing may provide for more die per wafer versus grid alignment approaches, in accordance with an embodiment of the present invention. Referring to FIG. 11, a freeform layout (e.g., a non-restricted layout on semiconductor wafer or substrate 1102) allows denser packing and hence more die per wafer versus grid alignment approaches (e.g., a restricted layout on semiconductor wafer or substrate 1100). In an embodiment, the speed of the laser ablation and plasma etch singulation process is independent of die size, layout or the number of streets.

A single process tool may be configured to perform many or all of the operations in a hybrid laser ablation and plasma etch singulation process. For example, FIG. 12 illustrates a block diagram of a tool layout for laser and plasma dicing of wafers or substrates, in accordance with an embodiment of the present invention.

Figure 12:
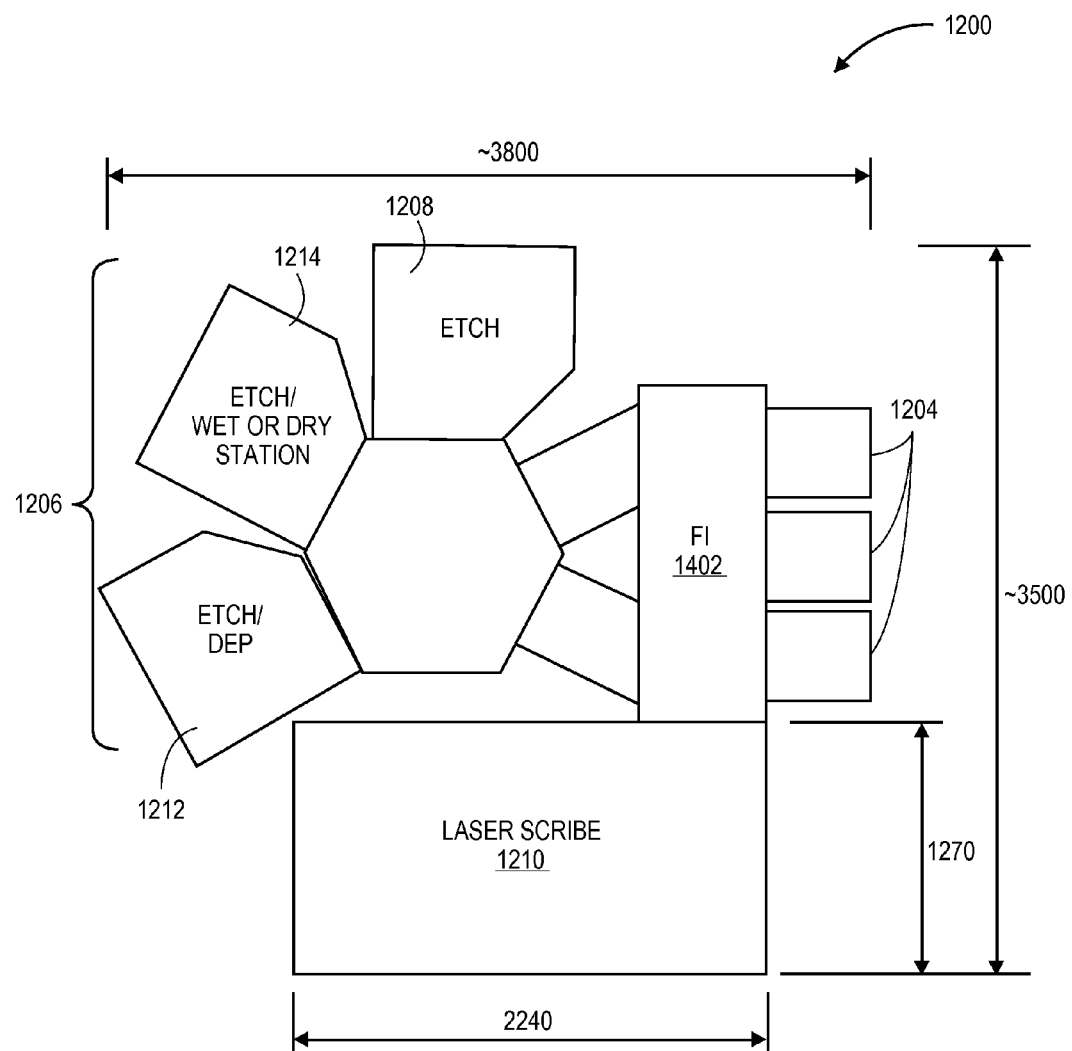
FIG. 12 illustrates a block diagram of a tool layout for laser and plasma dicing of wafers or substrates, in accordance with an embodiment of the present invention.

Referring to FIG. 12, a process tool 1200 includes a factory interface 1202 (FI) having a plurality of load locks 1204 coupled therewith. A cluster tool 1206 is coupled with the factory interface 1202. The cluster tool 1206 includes one or more plasma etch chambers, such as plasma etch chamber 1208. A laser scribe apparatus 1210 is also coupled to the factory interface 1202. The overall footprint of the process tool 1200 may be, in one embodiment, approximately 3500 millimeters (3.5 meters) by approximately 3800 millimeters (3.8 meters), as depicted in FIG. 12.

In an embodiment, the laser scribe apparatus 1210 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 1200, the moveable stage configured for moving a wafer or substrate (or a carrier thereof) relative to the femtosecond-based laser. In a specific embodiment, the femtosecond-based laser is also moveable. The overall footprint of the laser scribe apparatus 1210 may be, in one embodiment, approximately 2240 millimeters by approximately 1270 millimeters, as depicted in FIG. 12.

In an embodiment, the one or more plasma etch chambers 1208 is configured for etching a wafer or substrate through the gaps in a patterned mask to singulate a plurality of integrated circuits. In one such embodiment, the one or more plasma etch chambers 1208 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1208 to facilitate high silicon etch rates. In an embodiment, more than one etch chamber is included in the cluster tool 1206 portion of process tool 1200 to enable high manufacturing throughput of the singulation or dicing process. In accordance with an embodiment of the present invention, one or more of the etch chambers is equipped with a stationary actively-cooled shadow ring.

The factory interface 1202 may be a suitable atmospheric port to interface between an outside manufacturing facility with laser scribe apparatus 1210 and cluster tool 1206. The factory interface 1202 may include robots with arms or blades for transferring wafers (or carriers thereof) from storage units (such as front opening unified pods) into either cluster tool 1206 or laser scribe apparatus 1210, or both.

Cluster tool 1206 may include other chambers suitable for performing functions in a method of singulation. For example, in one embodiment, in place of an additional etch chamber, a deposition chamber 1212 is included. The deposition chamber 1212 may be configured for mask deposition on or above a device layer of a wafer or substrate prior to laser scribing of the wafer or substrate. In one such embodiment, the deposition chamber 1212 is suitable for depositing a water soluble mask layer. In another embodiment, in place of an additional etch chamber, a wet/dry station 1214 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 1200.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 124 or with etch chamber 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 13:
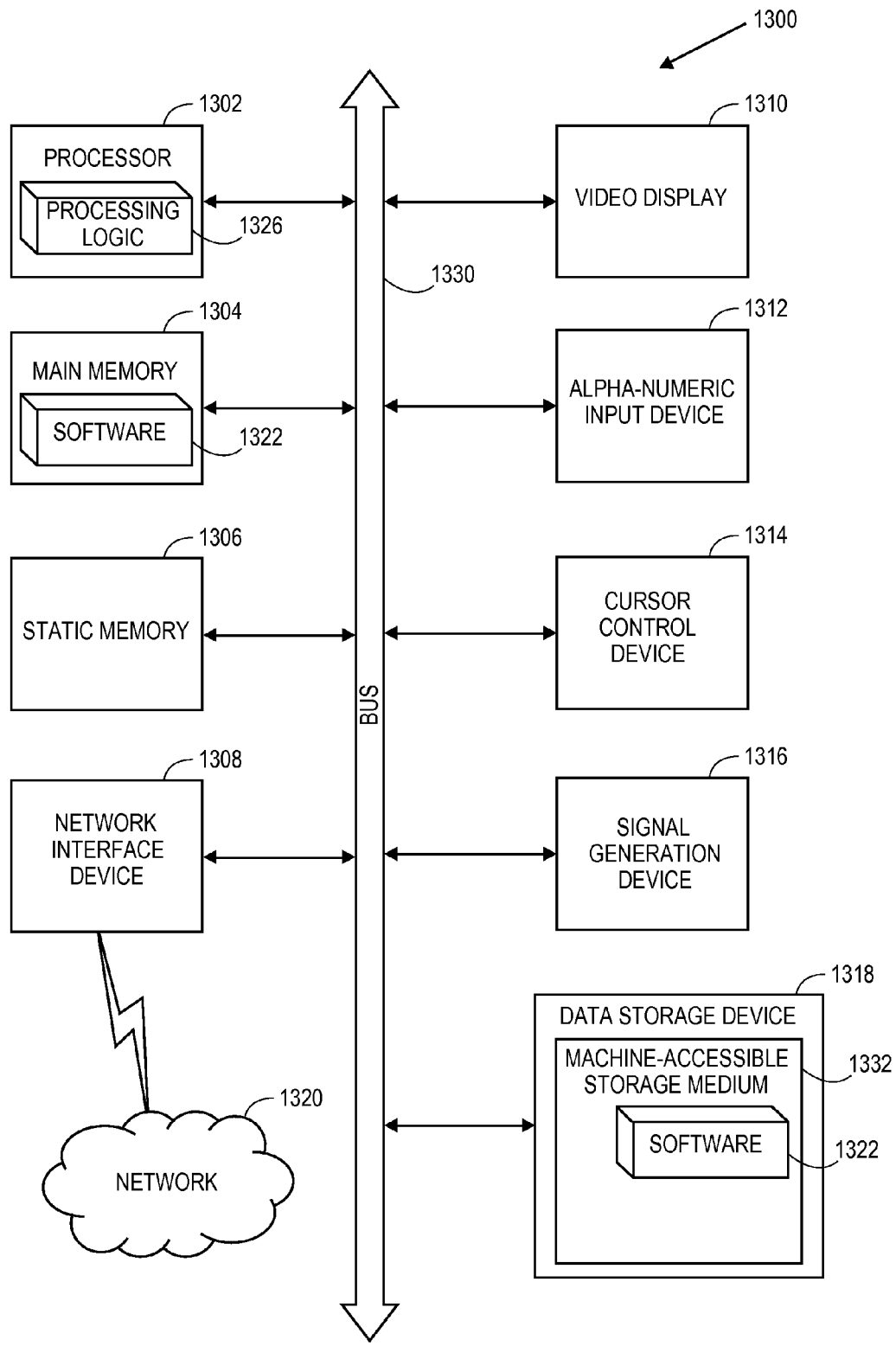
FIG. 13 illustrates a block diagram of an exemplary computer system, in accordance with an embodiment of the present invention.

FIG. 13 illustrates a diagrammatic representation of a machine in the exemplary form of a computer system 1300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations described herein.

The computer system 1300 may further include a network interface device 1308. The computer system 1300 also may include a video display unit 1310 (e.g., a liquid crystal display (LCD), a light emitting diode display (LED), or a cathode ray tube (CRT)), an alphanumeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1332 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

While the machine-accessible storage medium 1332 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves introducing a substrate supported by a substrate carrier into a plasma etch chamber. The substrate has a patterned mask thereon covering integrated circuits and exposing streets of the substrate. The method also involves situating the substrate carrier below a shadow ring having a cooling channel therein. The shadow ring is fixedly attached to a chamber wall of the plasma etch chamber. The method also involves plasma etching the substrate through the streets to singulate the integrated circuits. The shadow ring shields the substrate carrier from the plasma etching, and a cooling fluid is transported through the cooling channel of the shadow ring during the plasma etching.

In accordance with another embodiment of the present invention, a machine-accessible storage medium has instructions stored thereon which cause a data processing system to perform a method of plasma processing a sample. The method involves introducing a substrate carrier having a substrate thereon into a plasma processing chamber. The plasma processing chamber has a plasma source in an upper portion of the plasma processing chamber. The method also involves placing the substrate carrier on a cathode positioned at a lower sample receiving position. The method also involves moving the cathode to an upper sample processing position to situate the substrate carrier below an actively-cooled shadow ring. The actively-cooled shadow ring is fixedly attached to a chamber wall of the plasma processing chamber and is positioned between the upper sample processing position and the plasma source. The method also involves plasma processing the substrate on the substrate carrier. The actively-cooled shadow ring protects at least a portion of the substrate carrier during the plasma processing.

Thus, methods of and apparatuses for dicing semiconductor wafers, each wafer having a plurality of integrated circuits, have been disclosed.

What is claimed is:

1. A method of dicing a semiconductor wafer comprising a plurality of integrated circuits, the method comprising:
   introducing a substrate supported by a substrate carrier into a plasma etch chamber, the substrate having a patterned mask thereon covering integrated circuits and exposing streets of the substrate;
   situating the substrate carrier below a shadow ring having a cooling channel therein, the shadow ring fixedly attached to a chamber wall of the plasma etch chamber, wherein situating the substrate carrier below the shadow ring comprises covering a tape frame and open tape region of the substrate carrier, and covering the outermost approximately 1-1.5 millimeters of the entire circumference of the substrate supported by the substrate carrier; and
   plasma etching the substrate through the streets to singulate the integrated circuits, wherein the shadow ring shields the substrate carrier from the plasma etching, and wherein a cooling fluid is transported through the cooling channel of the shadow ring during the plasma etching, wherein transporting the cooling fluid through the cooling channel cools the shadow ring from a temperature greater than 260 degrees Celsius at a plasma exposed surface of the shadow ring to less than 120 degrees Celsius at a location where the substrate carrier is situated below the shadow ring during the plasma etching.

2. The method of claim 1, further comprising:
   chilling the cooling fluid at a location outside of the plasma etch chamber during the plasma etching.

3. The method of claim 1, further comprising:
   forming the patterned mask with a laser scribing process.

4. The method of claim 1, wherein situating the substrate carrier below the shadow ring comprises moving a cathode from a lower sample receiving position to an upper sample processing position.

* * * * *